(12) United States Patent
Matsumoto (10) Patent No.: US 7,719,089 B2
(45) Date of Patent: May 18, 2010

(54) MOSFET HAVING A CHANNEL REGION WITH ENHANCED FLEXURE-INDUCED STRESS

(75) Inventor: Koichi Matsumoto, Fishkill, NY (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 11/429,592

(22) Filed: May 5, 2006

(65) Prior Publication Data

US 2007/0257336 A1 Nov. 8, 2007

(51) Int. Cl.
*H01L 29/04* (2006.01)
(52) U.S. Cl. .................. 257/627; 257/628
(58) Field of Classification Search ......... 257/628, 257/627
See application file for complete search history.

(56) References Cited

U.S. PATENT DOCUMENTS

| | | | | |
|---|---|---|---|---|
| 5,341,015 | A * | 8/1994 | Kohno | 257/402 |
| 6,307,214 | B1 * | 10/2001 | Ohtani et al. | 257/59 |
| 2003/0040158 | A1 | 2/2003 | Saitoh | 438/279 |
| 2004/0217448 | A1 * | 11/2004 | Kumagai et al. | 257/627 |
| 2005/0110039 | A1 | 5/2005 | Chi et al. | 257/178 |
| 2005/0116360 | A1 | 6/2005 | Huang et al. | 257/900 |
| 2005/0196925 | A1 | 9/2005 | Kim et al. | 438/285 |
| 2005/0260810 | A1 | 11/2005 | Cheng et al. | 438/199 |
| 2005/0285150 | A1 * | 12/2005 | Birner et al. | 257/213 |
| 2006/0024879 | A1 | 2/2006 | Fu et al. | 438/216 |

OTHER PUBLICATIONS

Scott E. Thompson, et al. "A 90-nm Logic Technology Featuring Strained-Silicon", *IEEE Transactions on Electron Devices*, vol. 51, No. 11, Nov. 2004, pp. 1790-1797.
C.Gallon, et al., "Electrical Analysis of Mechanical Stress Induced by STI in Short MOSFETs Using Externally Applied Stress", *IEEE Transactions on Electron Devices*, vol. 51, No. 8, Aug. 2004, pp. 1254-1261.
T. Ghani, et al., "A 90nm High Volume Manufacturing Logic Technology Featuring Novel 45nm Gate Length Strained Silicon CMOS Transistors", *IEEE*, 2003, 3 pages.
H. S. Yang, et al., "Dual Stress Liner for High Performance Sub-45nm Gate Length SOI CMOS Manufacturing", *IEEE*, © 2004, 4 pages.

* cited by examiner

*Primary Examiner*—Kimberly D Nguyen
*Assistant Examiner*—Mohammad T Karimy
(74) *Attorney, Agent, or Firm*—Mayer & Williams PC; Stuart H. Mayer, Esq.; Karin L. Williams, Esq.

(57) ABSTRACT

A semiconductor device is provided that includes a semiconductor substrate, an n-channel MOSFET formed on the substrate and a p-channel MOSFET formed on the substrate. A first layer is formed to cover the n-channel MOSFET, wherein the first layer has a first flexure-induced stress. A second layer is formed to cover the p-channel MOSFET, wherein the second layer has a second flexure-induced stress.

15 Claims, 8 Drawing Sheets

MOSFET HAVING A CHANNEL REGION WITH ENHANCED FLEXURE-INDUCED STRESS

FIELD OF THE INVENTION

The present invention relates generally to MOSFET devices and more particularly to a MOFSET device in which the stress in the channel region is enhanced to increase carrier mobility.

BACKGROUND OF THE INVENTION

Reductions in size of metal-oxide-semiconductor field-effect transistors (MOSFET), including reductions in gate length and gate oxide thickness, has enabled the continued improvement in speed, performance, density, and cost per unit function of integrated circuits over the past few decades. To further enhance transistor performance, strain may be introduced in the transistor channel for improving carrier mobilities. Generally, it is desirable to induce a tensile strain in the n-channel of an nMOSFET in the source-to-drain direction, and to induce a compressive strain in the p-channel of a pMOSFET in the source-to-drain direction. There are several existing approaches of introducing strain in the transistor channel region.

In one approach, strain in the channel is introduced after the transistor is formed. In this approach, a high stress film is formed over a completed transistor structure formed in a silicon substrate. The high stress film or stressor exerts significant influence on the channel, modifying the silicon lattice spacing in the channel region, and thus introducing strain in the channel region. In this case, the stressor is placed above the completed transistor structure. This scheme is described, for example, in a paper by A. Shimizu et al., entitled "Local mechanical stress control (LMC): a new technique for CMOS performance enhancement," published in pp. 433-436 of the Digest of Technical Papers of the 2001 International Electron Device Meeting. This approach has met with limited success, however, since the formation of the stressed dielectric layer of a particular type of stress e.g., tensile or compressive, has a degrading electrical performance effect on a complementary field-effect transistor that includes an n-channel field-effect transistor and a p-channel field-effect transistor, which operate with opposite types of majority charge carriers. For example, as an nMOSFET device performance is improved by a particular stress, pMOSFET device performance is degraded.

As shown in U.S. Appl. Ser. No. 2003/0040158, a first nitride layer providing tensile stress is formed to cover the nMOSFET device in a complementary field-effect transistor and a second nitride layer providing compressive stress is formed to cover the pMOSFET device of the complementary field-effect transistor. The tensile stress of the first nitride layer is applied to the corresponding surface area of the substrate, thereby decreasing the compressive stress existing in the channel region of the n-channel MOSFET. Thus, the electron mobility is increased and as a result, the current driving capability of the n-channel MOSFET is improved. Likewise, the compressive stress of the second nitride layer is applied to the corresponding surface area of the substrate, thereby decreasing the tensile stress existing in the channel region of the p-channel MOSFET.

Despite the use of nitride layers to enhance the stress arising in the channel regions of MOSFET devices, carrier mobility and overall device performance would be enhanced still further if additional stress could be provided.

SUMMARY OF THE INVENTION

In accordance with the present invention, a semiconductor device is provided that includes a semiconductor substrate, an n-channel MOSFET formed on the substrate and a p-channel MOSFET formed on the substrate. A first layer is formed to cover the n-channel MOSFET, wherein the first layer has a first flexure-induced stress. A second layer is formed to cover the p-channel MOSFET, wherein the second layer has a second flexure-induced stress.

In accordance with one aspect of the invention, the first flexure-induced stress is a tensile stress.

In accordance with another aspect of the invention, the second flexure-induced stress is a compressive stress.

In accordance with another aspect of the invention, the first layer is a first nitride layer.

In accordance with another aspect of the invention, the second layer is a second nitride layer.

In accordance with another aspect of the invention, the semiconductor substrate is a silicon substrate having an (001) surface.

In accordance with another aspect of the invention, the semiconductor substrate is a silicon substrate having an (110) surface.

In accordance with another aspect of the invention, the first layer is selected to have an inherent stress in addition to a first flexure-induced stress.

In accordance with another aspect of the invention, the second layer is selected to have an inherent stress in addition to a second flexure-induced stress.

In accordance with another aspect of the invention, each of the n-channel MOSFET and the p-channel MOSFETs includes source/drain regions, a gate dielectric layer, a gate electrode, sidewall spacers, and silicide layers formed in a top of the gate electrode and in surfaces of the source/drain regions. The first nitride layer covers the source/drain regions, the gate dielectric layer, the gate electrode, the sidewall spacers, and the silicide layers of the n-channel MOSFET. The second nitride layer covers the source/drain regions, the gate dielectric layer, the gate electrode, the sidewall spacers, and the silicide layers of the p-channel MOSFET.

In accordance with another aspect of the invention, the first nitride layer is formed by a LPCVD process.

In accordance with another aspect of the invention, the second nitride layer is formed by a PECVD process.

In accordance with another aspect of the invention, the n-channel MOSFET has a channel region in a surface area of the substrate; and the tensile stress of the first nitride layer serves to relax a compressive stress existing in the channel region.

In accordance with another aspect of the invention, a method is provided for fabricating a semiconductor device. The method begins by forming a n-channel MOSFET and a p-channel MOSFET on a semiconductor substrate. The substrate is flexed with a first concavity. While the substrate is flexed with the first concavity, a first stress enhancing layer is formed over the substrate to cover the n-channel MOSFET and the p-channel MOSFET. A part of the first stress enhancing layer is selectively removed in an area corresponding to the p-channel MOSFET. The substrate is flexed with a second concavity opposite to the first concavity. While the substrate is flexed with the second concavity, a second stress enhancing layer is formed over the substrate to cover the n-channel MOSFET and the p-channel MOSFET. A part of the second stress enhancing layer is selectively removed in an area corresponding to the n-channel MOSFET is selectively removed.

DETAILED DESCRIPTION

Although the method of the present invention is explained with reference to exemplary n-channel and p-channel MOSFET devices, it will be appreciated that the method of the present invention may be applied to the formation of any MOSFET device where a strain is controllably introduced into a charge carrier channel region by selective formation and subsequent removal of buffer layers and/or stressed dielectric layers overlying the respective nMOSFET and/or pMOSFET device regions.

For purposes of illustration only, the MOSFET devices described herein are formed on silicon wafers with a (001) surface. Of course, the invention is applicable to other surfaces as well such as the (110) surface. The direction of current flow is along the <110> axis. The stress that is introduced is generally applied either parallel (longitudinal) to the direction of current flow between the source and drain or perpendicular (transverse) to the direction of current flow between the source and drain. The stress may also be applied out-of plane with respect to the direction of current flow. As discussed in Thompson et al., "90-NM Logic Technology Featuring Strained Silicon," IEEE Transactions on Electron Devices, Vol. 51, No. 11, November 2004, pp. 1790-1797, the most effective stresses to implement are longitudinal compressive stress for pMOSFETs and longitudinal tensile and out-of-plane compressive stress for nMOSFETs.

Figure 1A:
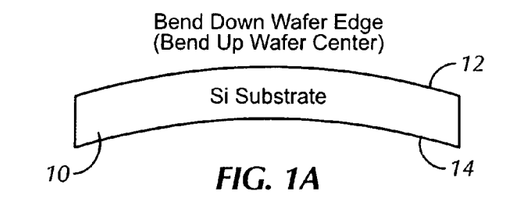
FIGS. 1-5 illustrate the underlying concepts employed in the present invention
Figure 1B:
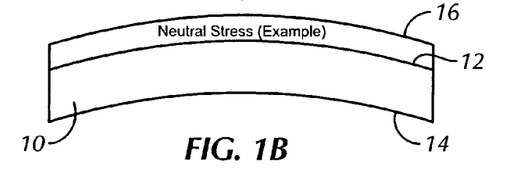
Figure 1C:
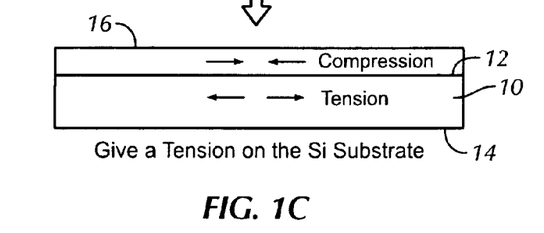

In accordance with the present invention, the stress in the channel region of a MOSFET is increased by bending or flexing the MOSFET substrate prior to the deposition of a high stress film over the completed transistor structure. FIGS. 1 and 2 illustrate the underlying concept that is employed. FIG. 1a shows a substrate 10 in which an nMOSFET is formed. The substrate 10 has an upper surface 12 on which the nMOSFET is formed and a lower surface 14 opposing the upper surface 12. As used herein "downward" refers to the direction from the upper surface 12 to the lower surface 14 and "upward" refers to the direction from the lower surface 14 to the upper surface 12. As shown in FIG. 1a the substrate 10 is flexed downward at its edges and upward at its center. Such flexure is also referred to as a "concave upward" flexure. Next, in FIG. 1b a film 16 is deposited on the upper surface 12 of the substrate 10 while it is flexed concave upward. For purposes of illustration the film 16 is assumed to apply a neutral stress (i.e., neither compressive or tensile stress). After the deposition of film 16 the substrate 10 is released in FIG. 1c so that it is no longer flexed. As indicated by the arrows in FIG. 1c, upon release the film 16 experiences a compressive stress. The compressive stress in the film 16 causes an increase in the tensile stress existing in the substrate 10. As previously mentioned by increasing the tensile stress in the substrate 10, the carrier mobility is enhanced for an nMOSFET device.

Figure 2A:
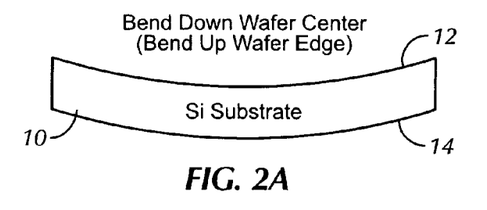
Figure 2B:
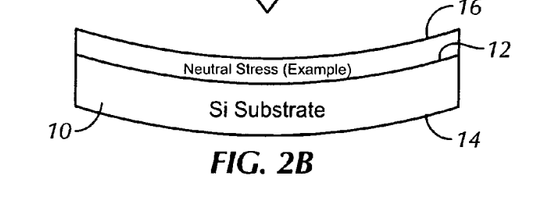
Figure 2C:
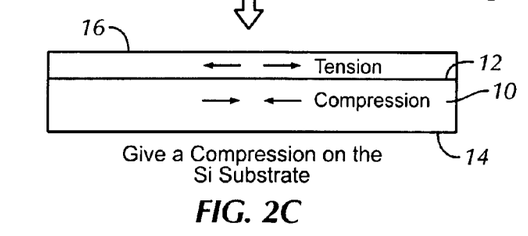

FIG. 2a shows a pMOSFET formed in the substrate 10. As shown in FIG. 2a the substrate 10 is flexed upward at its edges and downward at its center. Such flexure is also referred to as a "concave downward" flexure. Next, in FIG. 2b a film 16 is deposited on the upper surface 12 of the substrate 10 while it is flexed concave downward. Once again, for purposes of illustration the film 16 is assumed to apply a neutral stress (i.e., neither compressive or tensile stress). After the deposition of film 16 the substrate 10 is released in FIG. 2c so that it is no longer flexed. As indicated by the arrows in FIG. 1c, upon release the film 16 now experiences a tensile stress. The tensile stress in the film 16 causes an increase in the compressive stress existing in the substrate 10. As previously mentioned by increasing the compressive stress in the substrate 10, the carrier mobility is enhanced for a pMOSFET device.

Figure 3A:
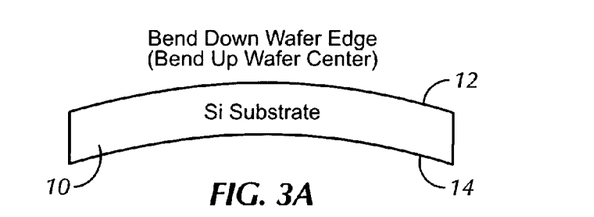
Figure 3B:
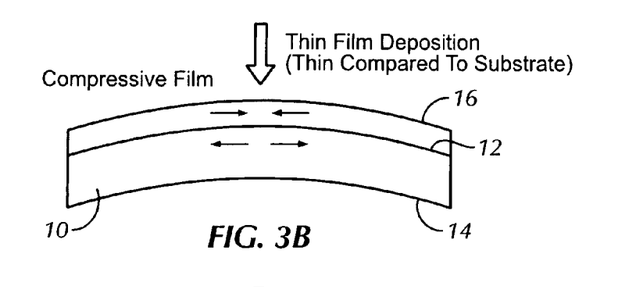
Figure 3C:
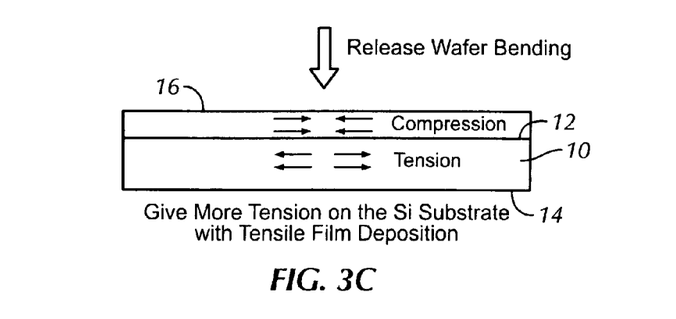
Figure 4A:
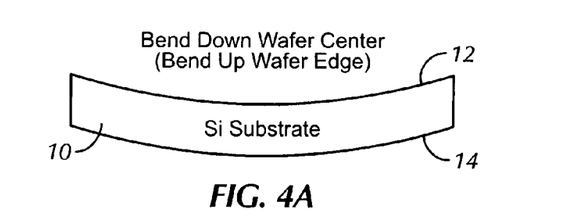
Figure 4B:
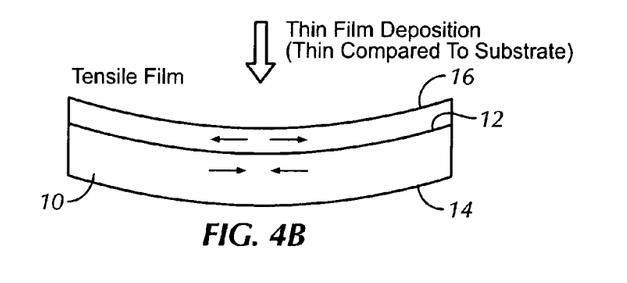
Figure 4C:
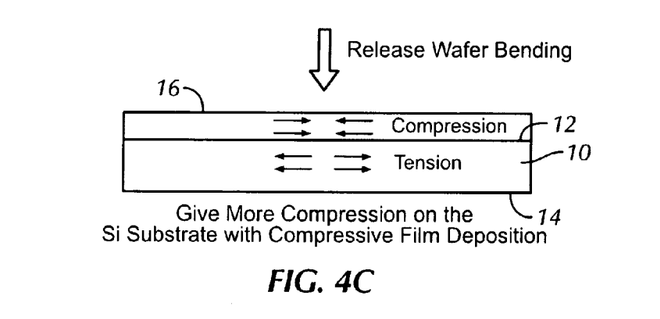

The principles illustrated in FIGS. 1 and 2 are also applicable when the film 16 itself has a compressive or tensile stress even without flexure. In FIGS. 3a-3c the film 16 has a compressive stress when it is deposited on substrate 10 in FIG. 3b. Because of this initial compressive stress in film 16, the net compressive stress in the film 16 after the substrate is released in FIG. 3c is even greater than when a neutral stress film is deposited, which in turn gives rise to an even greater tensile stress in the substrate 10. The greater tensile stress gives rise to an increased carrier mobility in an nMOSFET formed in the substrate 16. Similarly, in FIGS. 4a-4c the film 16 has a tensile stress when it is deposited on substrate 10 in FIG. 4b. Because of this initial tensile stress in film 16, the net tensile stress in the film 16 after the substrate is released in FIG. 4c is even greater than when a neutral stress film is deposited, which in turn gives rise to an even greater compressive stress in the substrate 10. The greater compressive stress gives rise to an increased carrier mobility in a pMOSFET formed in the substrate 10.

FIG. 5 illustrates the manner in which a substrate 10 may be flexed to accommodate both an nMOSFET and a pMOSFET so that the carrier mobilities of each is increased. This example assumes that an nMOSFET is formed on the leftmost portion of the substrate 10 and a PMOSFET on the rightmost portion of the substrate. Of course, those of ordinary skill in the art will recognize that by an appropriate change in the sequence of the concave upward and downward flexures the location of the two devices may be switched.

Figure 5A:
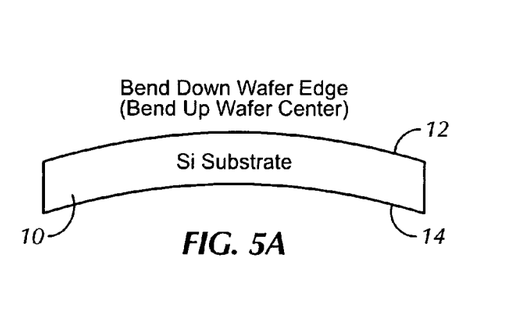
Figure 5B:
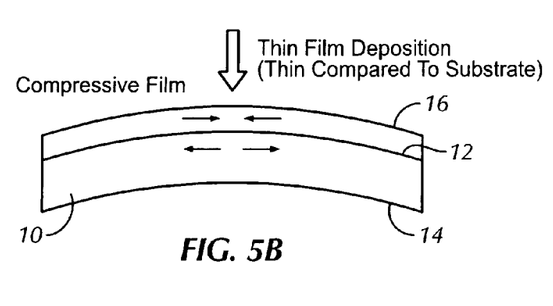
Figure 5C:
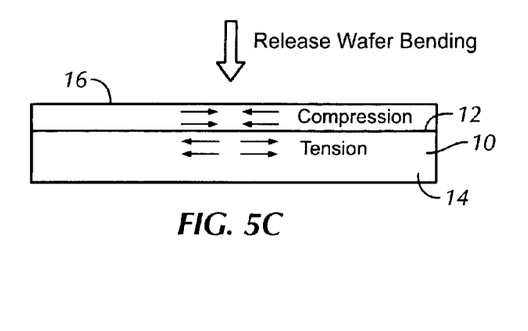
Figure 5D:
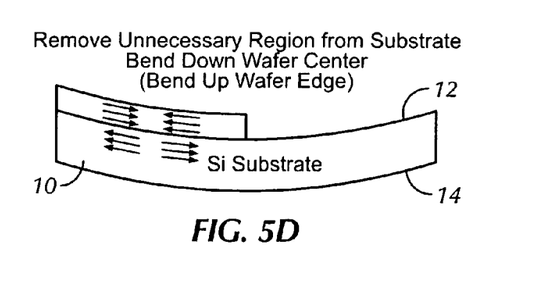
Figure 5E:
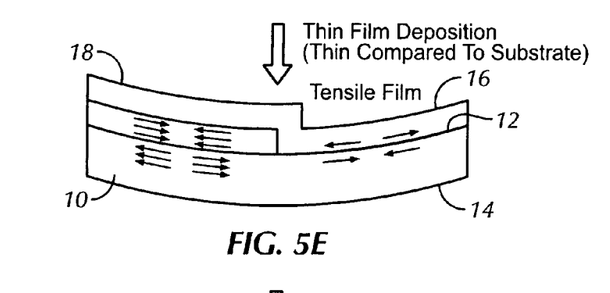
Figure 5F:
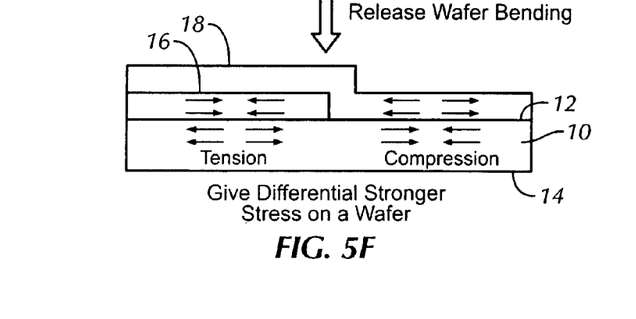
Figure 5G:
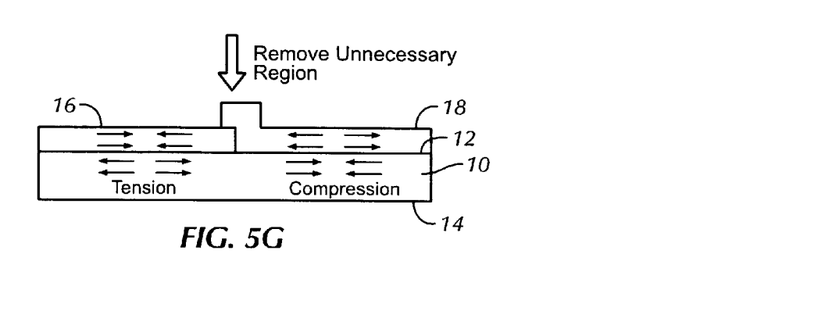

FIGS. 5a-5c are similar to FIGS. 3a-3c described above in which a concave upward flexure is employed to establish a tensile stress in the substrate 10, which enhances the carrier mobility of an nMOSFET formed in the leftmost portion of the substrate. Of course, in FIG. 5c this tensile stress extends along the entire length of the substrate 10 since the compressive film 16 extends along the entire substrate 10. In FIG. 5d the film 16 is removed from the rightmost portion of the substrate 10 and the substrate 10 is flexed concave downward. In FIG. 5e a tensile film 18 is deposited over the exposed surface of the substrate 10 and the remaining portion of the film 16. Upon release of the substrate 10 in FIG. 5f, the tensile stress in film 18 gives rise to a compressive stress in the rightmost portion of the substrate 10 that gives rise to an increased carrier mobility to a pMOSFET formed in the leftmost portion the substrate 10. Finally, in FIG. 5g the portion of the film 18 overlying the film 16 is removed. As indicated by the arrows in FIG. 5g, a tensile stress is established in the leftmost portion of the substrate 10 (suitable for an nMOSFET) and a compressive stress is established in the rightmost portion of the substrate 10 (suitable for a pMOSFET).

FIGS. 6A to 6E show the process steps of a method of fabricating a known semiconductor device having an n-channel MOSFET and a p-channel MOSFET on a single-crystal Si substrate using the techniques presented above.

Figure 6A:
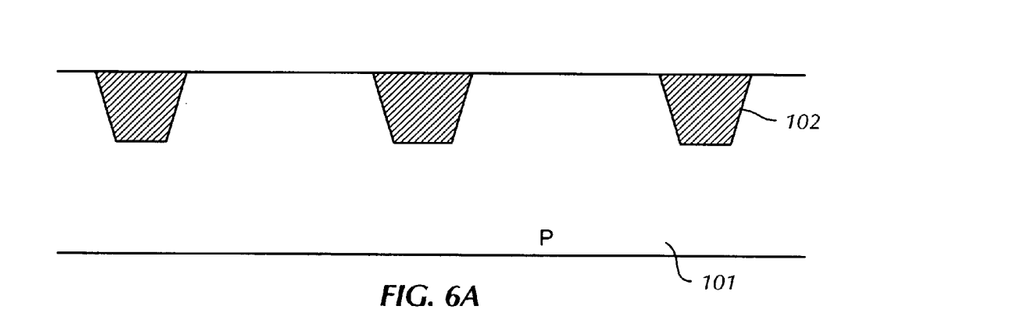
FIGS. 6a-6e illustrate a process flow for fabricating n- and pMOSFETS in accordance with one embodiment of the present invention.

First, as shown in FIG. 6A, a desired recess or recesses are formed in the surface area of a p-type single-crystal Si substrate 101 using a patterned silicon nitride ($SiN_x$) layer (not shown) as a mask by a Reactive Ion Etching (RIE) process. Then, a silicon dioxide ($SiO_2$) layer (not shown) is grown on the surface of the substrate 101 by using a High-Density Plasma source. The surface of the substrate 101 on which the $SiO_2$ layer has been grown is planarized by a Chemical Mechanical Polishing,(CMP) process, thereby leaving selectively the $SiO_2$ layer in the recess or recesses. Thus, an isolation region 102 is selectively buried in the recess or recesses in the substrate 101 to thereby form an active region in which a n-channel MOSFET (i.e., NMOS) is formed and an active region in which a p-channel MOSFET (i.e., PMOS) is formed, as shown in FIG. 6a.

Figure 6B:
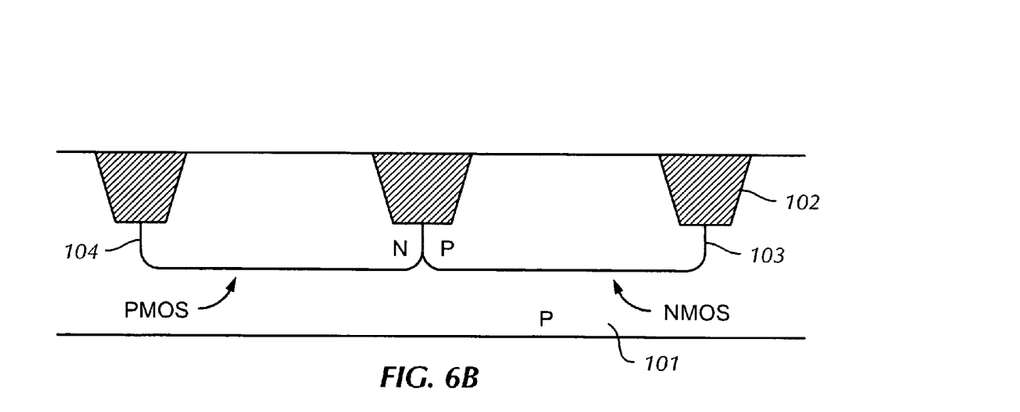

Thereafter, in FIG. 6b a p-type dopant is selectively implanted into one of the active regions of the substrate 101 by an ion implantation process, thereby forming a p-type well 103 in which a n-channel MOSFET is formed. Similarly, a n-type dopant is selectively implanted into another of the active regions of the substrate 101 by an ion implantation process, thereby forming a n-type well 104 in which a p-channel MOSFET is formed.

Figure 6C:
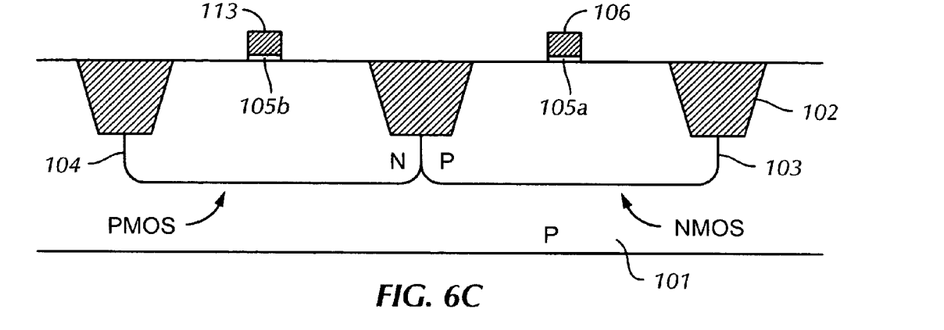

In FIG. 6c, a dielectric layer (not shown) for gate dielectric layers 105a and 105b is formed on the whole surface of the substrate 101 by a thermal oxidation process. A polysilicon layer (not shown) is deposited on the dielectric layer thus formed over the whole substrate 101 by a Low-Pressure Chemical Vapor Deposition (LPCVD) process. The dielectric layer and the polysilicon layer are patterned to thereby form a gate dielectric layer 105a and a gate electrode 106 on the p-type well 103 and a gate dielectric layer 105b and a gate electrode 113 on the n-type well 104.

Figure 6D:
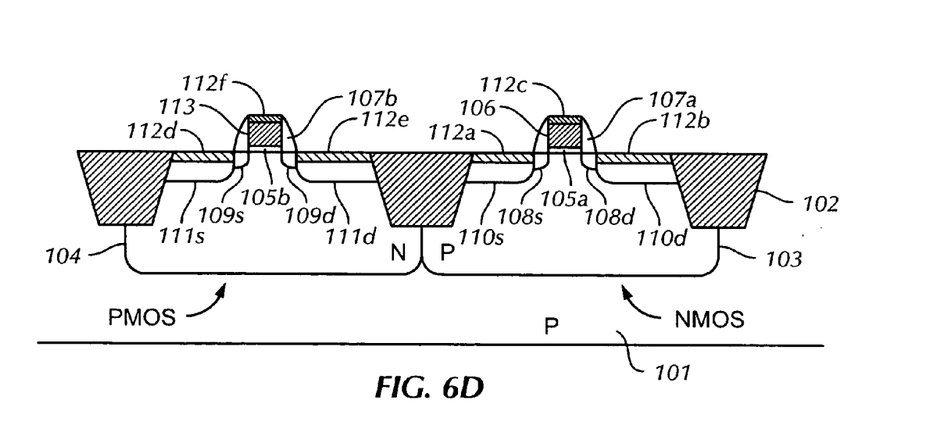

Using a patterned photoresist film (not shown) and the gate electrode 106 as a mask, a n-type dopant is selectively introduced into the p-type well 103 in FIG. 6d, thereby forming a n-type Lightly Doped Drain (LDD) region 108s and a n-type LDD region 108d in the well 103 at each side of the electrode 106. Similarly, using a patterned photoresist film (not shown) and the gate electrode 113 as a mask, a p-type dopant is selectively introduced into the n-type well 104, thereby forming a p-type LDD region 109s and a p-type LDD region 109d in the well 104 at each side of the electrode 113.

Also in FIG. 6d, a $SiO_2$ layer (not shown) is formed on the whole surface of the substrate 101 to cover the gate electrodes 106 and 113 and then, it is patterned by a RIE process. Thus, a pair of dielectric sidewall spacers 107a is formed on the surface of the p-type well 103 at each side of the gate electrode 106 and a pair of dielectric sidewall spacers 107b is formed on the surface of the n-type well 104 at each side of the gate electrode 113.

Using a patterned photoresist film (not shown), the gate electrode 106, and the pair of sidewall spacers 107a as a mask, a n-type dopant is selectively introduced into the p-type well 103 to overlap with the n-type LDD regions 108s and 108d, thereby forming a n-type diffusion region 110s and a n-type diffusion region 110d in the well 103 at each side of the electrode 106. These n-type regions 108s and 110s serve as the source region of the n-channel MOSFET while these n-type regions 108d and 110d serve as the drain region thereof. Similarly, using a patterned photoresist film (not shown), the gate electrode 113, and the pair of sidewall spacers 107b as a mask, a p-type dopant is selectively introduced into the n-type well 104 to overlap with the p-type LDD regions 109s and 109d, thereby forming a p-type diffusion region 111s and a p-type diffusion region 111d in the well 104 at each side of the electrode 113. The p-type regions 109s and 111s serve as the source region of the p-channel MOSFET while the p-type regions 109d and serve as the drain region thereof. Thereafter, to activate the dopants thus introduced into the substrate 101, an annealing or heat-treatment process is performed.

A cobalt (Co) or titanium (Ti) layer is deposited on the whole surface of the substrate 101 by a sputtering process and then, a heat-treatment process is carried out, thereby causing a silicidation reaction of the diffusion regions 110s, 110d, 111s, and 111d made of single-crystal Si and the gate electrodes 106 and 113 made of polysilicon with the Co or Ti layer thus deposited. Thus, Co or Ti silicide layers 112a, 112b, 112c, 112d, 112e, and 112f are formed in FIG. 6d. The silicide layers 112a and 112b are located in the surfaces of the diffusion regions 110s and 110d, respectively. The silicide layer 112c is located in the surface of the gate electrode 106. The silicide layers 112d and 112e are located in the surfaces of the diffusion regions 111s and 111d, respectively. The silicide layer 112f is located in the surface of the gate electrode 113.

Figure 6E:
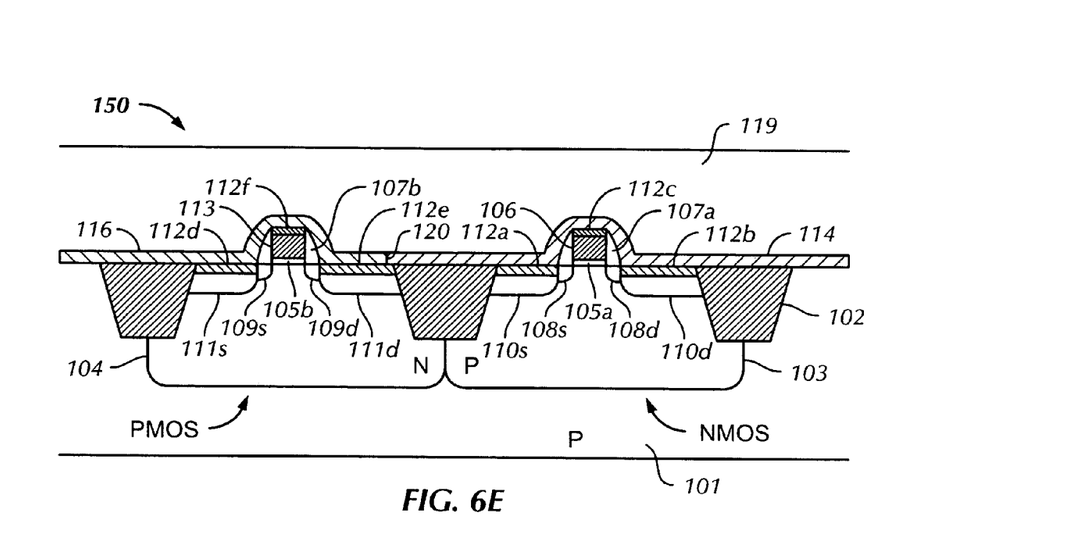

Subsequently, as shown in FIG. 6e a stress enhancement layer such as silicon nitride ($SiN_x$) layer 114, which has a tensile stress, is selectively formed on the surface of the substrate 101 in such a way as to cover the n-channel MOSFET (i.e., the whole surface of the p-type well 103). The layer 114 is contacted with the silicide layers 112a, 112b, and 112c, the sidewall spacers 107a, the gate electrode 106, and part of the isolation region 102. The tensile stress of the layer 114 is applied to the surface of the p-type well 103, thereby decreasing the compressive stress existing in the channel region of the n-channel MOSFET. During the formation of silicon nitride layer 114 the substrate 101 is flexed concave upward. The formation of silicon nitride layer 114 will be discussed in more detail in connection with FIGS. 7a-7d.

In addition, as further shown in FIG. 6e a stress enhancement layer such as $SiN_x$ layer 116, which has a compressive stress, is selectively formed on the surface of the substrate 101 in such a way as to cover the p-channel MOSFET (i.e., the whole surface of the n-type well 104). The layer 116 is contacted with the silicide layers 112d, 112e, and 112f, the sidewall spacers 107b, the gate electrode 113, and part of the isolation region 102. The compressive stress of the layer 116 is applied to the surface of the n-type well 104, thereby decreasing the tensile stress existing in the channel region of the p-channel MOSFET. During the formation of silicon nitride layer 116 the substrate 101 is flexed concave downward. The formation of silicon nitride layer 116 will be discussed in more detail in connection with FIGS. 7a-7d.

Figure 7A:
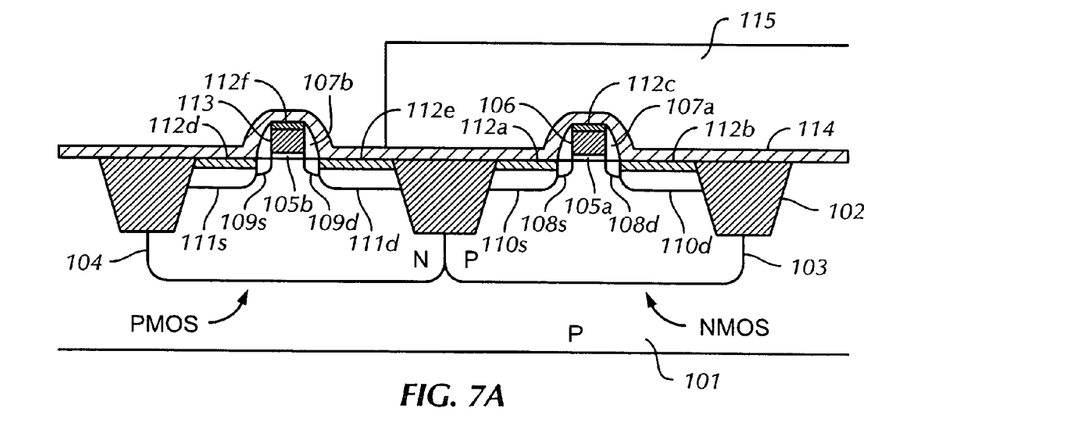
FIGS. 7a-7e illustrate the formation of the stress enhancements layers shown in FIG. 6e.

The following process steps are used to form the silicon nitride layers 114 and 116. As shown in FIG. 7A, following the silicidation process for the silicide layers 112a, 112b, 112c, 112d, 112e, and 112f of Co or Ti, the SiNx layer 114 having tensile stress is formed on the whole surface of the substrate 101 in such a way as to cover the n- and p-channel MOSFETs by a LPCVD process. During formation of silicon nitride layer 114 the substrate is flexed concave upward. Then, a patterned photoresist film 115 is formed on the SiNx layer 114 thus formed. The film 115 exposes selectively the area corresponding to the p-channel MOSFET and other necessary areas.

Figure 7B:
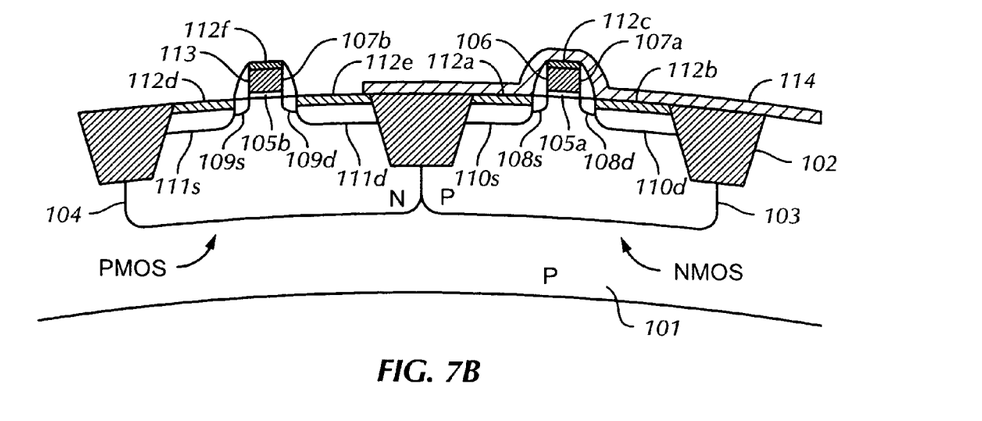

Next, using the patterned photoresist film 115 as a mask, the SiNx layer 114 is selectively removed by an etching process, as shown in FIG. 7B. Thus, the surface of the n-type well 104 and the other necessary areas are exposed from the layer 114. The film 115 is then removed from the substrate 101.

Figure 7C:
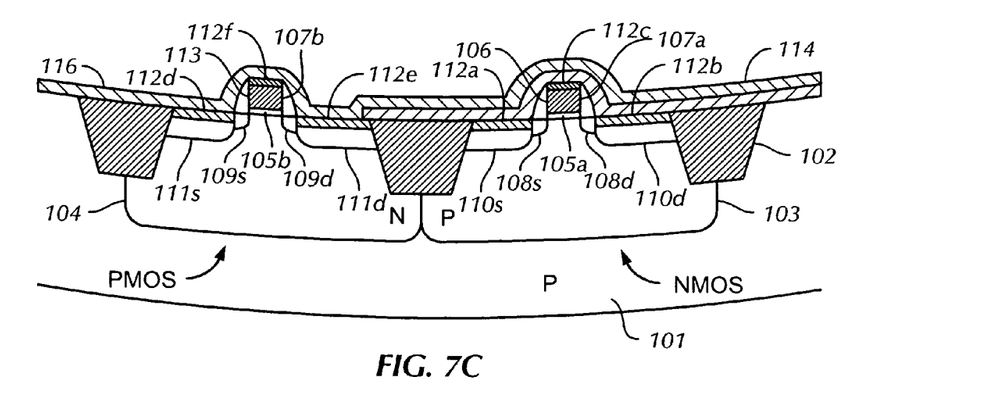

Subsequently, as shown in FIG. 7C, the SiNx layer 116 having a compressive stress is formed on the SiNx layer 14 to cover the whole surface of the substrate 101 by a Plasma-Enhanced CVD (PECVD) process. During formation of silicon nitride layer 116 the substrate 101 is flexed concave downward. In the PECVD process, hydrogen (H) is introduced into the film 116 and as a result, an actual compressive stress is generated in the film 116. Thus, any PECVD process is preferred for this purpose if H is introduced into the film 116. The layer 116 is contacted with the SiNx layer 114 and the top of the p-channel MOSFET.

Figure 7D:
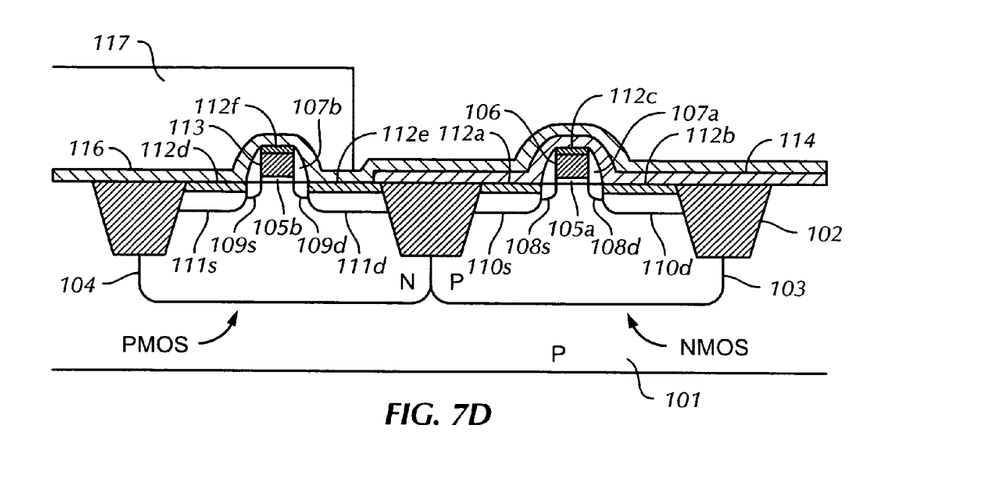
Figure 7E:
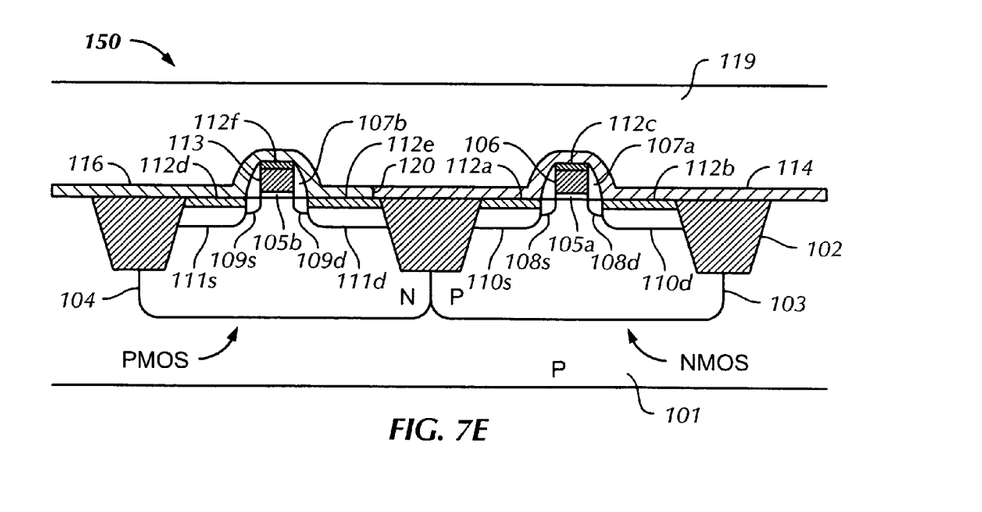

Then, a patterned photoresist film 117 is formed on the SiN$_x$ layer 116, as shown in FIG. 7D. The film 117 exposes selectively the area corresponding to the n-channel MOSFET and other necessary areas. Using the patterned photoresist film 117 as a mask, the SiN$_x$ layer 116 is selectively removed by a plasma etching process. Thus, the underlying SiN$_x$ layer 114 is selectively exposed in the surface of the p-type well 104 and the other necessary areas, as shown in FIG. 7e. The SiN$_x$ layers 114 and 116 are contacted with each other at the boundary 120. The film 117 is then removed from the substrate 101.

After formation of silicide layers 114 and 116, a thick interlayer dielectric layer 119, which is made of BPSG (Boro-PhosphorSilicate Glass), is formed on the silicon nitride layers 114 and 116 by a CVD process over the whole substrate 101. The surface of the layer 119 is planarized and then, necessary contact or through holes (not shown) are formed to penetrate the layer 119 and the layers 114 and 116. These contact holes are used for contacting the source and drain regions and the gate electrodes 106 and 113 of the n- and p-channel MOSFETs with wiring lines (not shown) to be formed on or over the layer 119. Typically, tungsten (W) is used for the conductive contact plugs filled in the contact holes. Titanium (Ti) or titanium nitride (TiN) is usually used as the barrier metal along with the W plugs. The wiring lines, which are formed on or over the layer 119 and connected to the contact plugs, are typically made of aluminum (Al). These wiring lines of Al are typically made by depositing an Al layer by a sputtering process and pattering the Al layer thus deposited.

Although various embodiments are specifically illustrated and described herein, it will be appreciated that modifications and variations of the present invention are covered by the above teachings and are within the purview of the appended claims without departing from the spirit and intended scope of the invention. For example, if a p- and nMOSFET is formed on a (001) silicon surface, and the direction of current flow is along the <100> direction, stressing the channel region of the pMOSFET will not significantly affect carrier mobility, while stressing the channel region of the nMOSFET will increase carrier mobility. In this case the stress most appropriate for nMOSFET may be applied to the entire device without a significant detrimental impact on the pMOSFET.

The invention claimed is:

1. A semiconductor device comprising:
    a semiconductor substrate, said semiconductor substrate having a top surface, said top surface having a first side and a second side, the first side being adjacent to the second side;
    an n-channel MOSFET formed on the first side of the substrate;
    a first layer formed to cover only the n-channel MOSFET, wherein the first layer has a first flexure-induced stress, wherein said first layer is formed while said n-channel MOSFET and said semiconductor substrate are flexed, thereby causing a compressive stress within said first layer upon release from being flexed, wherein the first flexure-induced stress is greater than an inherent stress of the first layer, said inherent stress of the first layer being the stress of the first layer when said first layer is without flexure;
    a p-channel MOSFET formed on the second side of the substrate;
    a second layer, formed to cover only the p-channel MOSFET, wherein the second layer has a second flexure-induced stress, wherein said second layer is formed while said p-channel MOSFET and said semiconductor substrate are flexed, thereby causing a tensile stress within said second layer upon release from being flexed, wherein the second flexure-induced stress is greater than an inherent stress of the second layer, said inherent stress of the second layer being the stress of the second layer when said second layer is without flexure.

2. The device according to claim 1 wherein the first layer is a first nitride layer.

3. The device according to claim 2 wherein the n-channel MOSFET has a channel region in a surface area of the substrate; and wherein the tensile stress of the first nitride layer serves to relax a compressive stress existing in the channel region.

4. The device according to claim 1 wherein the second layer is a second nitride layer.

5. The device according to claim 1 wherein the semiconductor substrate is a silicon substrate having an (001) surface.

6. The device according to claim 1 wherein the semiconductor substrate is a silicon substrate having an (110) surface.

7. The device according to claim 1 wherein the first layer is selected to have an inherent stress in addition to the first flexure-induced stress.

8. The device according to claim 1 wherein the second layer is selected to have an inherent stress in addition to the second flexure-induced stress.

9. The device according to claim 1, wherein each of the n-channel MOSFET and the p-channel MOSFETs comprises source/drain regions, a gate dielectric layer, a gate electrode, sidewall spacers, and silicide layers formed in a top of the gate electrode and in surfaces of the source/drain regions; and wherein a first nitride layer covers the source/drain regions, the gate dielectric layer, the gate electrode, the sidewall spacers, and the silicide layers of the n-channel MOSFET; and wherein a second nitride layer covers the source/drain regions, the gate dielectric layer, the gate electrode, the sidewall spacers, and the silicide layers of the p-channel MOSFET.

10. The device according to claim 9 wherein the first nitride layer is formed by a LPCVD process.

11. The device according to claim 9 wherein the second nitride layer is formed by a PECYD process.

12. A semiconductor device comprising:
    a semiconductor substrate, said semiconductor substrate having a top surface, said top surface having a first side and a second side, the first side being adjacent to the second side;
    an n-channel MOSFET formed on the first side of the substrate;
    a first layer formed to cover only the n-channel MOSFET, wherein the first layer has a first flexure-induced stress, wherein said first layer is formed while said n-channel MOSFET and said semiconductor substrate are flexed, thereby causing a compressive stress within said first layer greater than an inherent stress of the first layer upon release from being flexed;
a p-channel MOSFET formed on the second side of the substrate;
a second layer formed to cover only the p-channel MOSFET, wherein the second layer has a second flexure-induced stress, wherein said second layer is formed while said p-channel MOSFET and said semiconductor substrate are flexed, thereby causing a tensile stress within said second layer greater than an inherent stress of the second layer upon release from being flexed.

13. The device according to claim 12, wherein the first layer is a first nitride layer.

14. The device according to claim 13, wherein the second layer is a second nitride layer.

15. The device according to claim 14, wherein each of the n-channel MOSFET and the p-channel MOSFETs further includes source/drain regions, a gate dielectric layer, a gate electrode, sidewall spacers, and silicide layers formed in a top of the gate electrode and in surfaces of the source/drain regions; and wherein the first nitride layer covers the source/drain regions, the date dielectric layer, the gate electrode, the sidewall spacers, and the silicide layers of the n-channel MOSFET; and wherein the second nitride layer covers the source/drain regions, the gate dielectric layer, the gate electrode, the sidewall spacers, and the silicide layers of the p-channel MOSFET.

* * * * *

UNITED STATES PATENT AND TRADEMARK OFFICE
CERTIFICATE OF CORRECTION

PATENT NO. : 7,719,089 B2  Page 1 of 1
APPLICATION NO. : 11/429592
DATED : May 18, 2010
INVENTOR(S) : Koichi Matsumoto It is certified that error appears in the above-identified patent and that said Letters Patent is hereby corrected as shown below:

Col. 3, line 2, after "MOSFET", delete -- is selectively removed --.

Col. 3, line 59, after "compressive", change "or" to -- nor --.

Col. 3, line 65, after "previously", change "mentioned" to -- mentioned, --.

Col. 4, line 8, after "compressive", change "or" to -- nor --.

Col. 4, line 60, after "portion", insert -- of --.

Col. 6, line 5, after "and", insert -- 111d --.

Col. 8, line 55, after "a,", change "PECYD" to -- PECVD --.

Signed and Sealed this

Sixth Day of July, 2010

David J. Kappos
*Director of the United States Patent and Trademark Office*